(12) United States Patent
Yin et al.

(10) Patent No.: US 8,754,482 B2
(45) Date of Patent: Jun. 17, 2014

(54) SEMICONDUCTOR DEVICE AND MANUFACTURING METHOD THEREOF

(75) Inventors: Huaxiang Yin, Beijing (CN); Qiuxia Xu, Beijing (CN); Dapeng Chen, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 184 days.

(21) Appl. No.: 13/394,809

(22) PCT Filed: Nov. 25, 2011

(86) PCT No.: PCT/CN2011/001966
§ 371 (c)(1),
(2), (4) Date: Mar. 7, 2012

(87) PCT Pub. No.: WO2013/020255
PCT Pub. Date: Feb. 14, 2013

(65) Prior Publication Data
US 2013/0037822 A1 Feb. 14, 2013

(30) Foreign Application Priority Data

Aug. 8, 2011 (CN) .......................... 2011 1 0225524

(51) Int. Cl.
*H01L 21/8238* (2006.01)
*H01L 29/78* (2006.01)
(52) U.S. Cl.
USPC ................... 257/374; 438/232; 257/E21.431
(58) Field of Classification Search
CPC ..................... H01L 29/66636; H01L 29/7848; H01L 29/7843; H01L 21/823814

USPC ........... 257/374, E21.431, E29.105; 438/232, 438/302
See application file for complete search history.

(56) References Cited

U.S. PATENT DOCUMENTS

| | | | |
|---|---|---|---|
| 7,927,989 B2 | 4/2011 | Zhang et al. | 438/524 |
| 8,035,141 B2 | 10/2011 | Chan et al. | 257/288 |
| 2005/0017309 A1* | 1/2005 | Weber et al. | 257/376 |
| 2006/0011982 A1* | 1/2006 | Forbes | 257/347 |
| 2007/0290264 A1* | 12/2007 | Sugii et al. | 257/348 |
| 2008/0014688 A1* | 1/2008 | Thean et al. | 438/197 |
| 2008/0042211 A1* | 2/2008 | Bhattacharyya et al. | 257/369 |
| 2008/0121932 A1 | 5/2008 | Ranade | 257/192 |
| 2009/0014805 A1* | 1/2009 | Chidambaram et al. | 257/369 |
| 2009/0026552 A1 | 1/2009 | Zhang et al. | 257/401 |
| 2009/0267149 A1* | 10/2009 | Hua et al. | 257/347 |
| 2010/0295127 A1* | 11/2010 | Cheng et al. | 257/347 |
| 2011/0095343 A1 | 4/2011 | Chan et al. | 257/288 |
| 2011/0163360 A1 | 7/2011 | Zhang et al. | 257/288 |
| 2011/0201165 A1* | 8/2011 | Hoentschel et al. | 438/229 |

FOREIGN PATENT DOCUMENTS

| CN | 2720640 Y | 8/2005 | ............ H01L 29/78 |
|---|---|---|---|
| CN | 101517717 A | 8/2009 | ............ H01L 21/336 |

* cited by examiner

*Primary Examiner* — Steven J Fulk
(74) *Attorney, Agent, or Firm* — Martine Penilla Group, LLP

(57) ABSTRACT

A semiconductor device and its manufacturing method are provided. The semiconductor device comprises: a semiconductor substrate of a first semiconductor material, a gate structure on the semiconductor substrate, a crystal lattice dislocation line in a channel under the gate structure for generating channel stress, wherein the crystal lattice dislocation line being at an angle to the channel.

20 Claims, 4 Drawing Sheets

SEMICONDUCTOR DEVICE AND MANUFACTURING METHOD THEREOF

CLAIM OF PRIORITY

This application is a Section 371 National Stage Application of International Application No. PCT/CN2011/001966, filed on Nov. 25, 2011, which claims priority to Chinese Application No. CN201110225524.7, filed on Aug. 8, 2011 entitled "Semiconductor Device and Manufacturing Method Thereof", the entire contents of which are incorporated herein by reference in their entirety.

FIELD OF THE INVENTION

The invention relates to the technical field of semiconductor, in particular to a semiconductor device and the manufacturing method thereof.

BACKGROUND OF THE INVENTION

It has been proved both by theories and experiences that when stress is applied to the channel of a transistor, the semiconductor crystal lattice in the channel will have a strain, by which the carrier mobility of the transistor will be increased or reduced; however, it is also known that electrons and holes have different responses to strains of the same type. For example, it is advantageous to the increase of the hole mobility by applying a compressive stress in a longitudinal direction along which the electric current flows to cause a compressive strain on the crystal lattice in the channel region, but this accordingly reduces the electron mobility; it is advantageous to the increase of the electron mobility by applying a tensile stress in the longitudinal direction to cause a tensile strain on the crystal lattice in the channel region, but this accordingly reduces the hole mobility. With the continuous reduction in the feature size of the device, the strain channel engineering for the purpose of increasing the channel carrier mobility becomes more and more important.

However, in the prior art, the strain introduced into the channel region is very small. Since the carrier mobility increases with the increase in the stress amplitude in the transistor channel region, the performance of the transistor will be further improved if a larger stress is generated in the channel region of the transistor.

In view of the above, with respect to transistor devices, there is still a need for a new method and semiconductor structure for introducing strain.

SUMMARY OF THE INVENTION

According to one aspect of the present invention, a semiconductor device is provided, which comprises:

a semiconductor substrate of a first semiconductor material, a gate structure on the semiconductor substrate, a crystal lattice dislocation line in a channel under the gate structure for generating channel stress, the crystal lattice dislocation line being at an angle to the channel.

Wherein the crystal lattice dislocation line applies a mechanical stress to the channel, a compressive stress or a tensile stress is generated in the channel according to the angle between the crystal lattice dislocation line and the channel.

Wherein the crystal lattice dislocation line is formed by pre-amorphization implantation and annealing.

Wherein the implantation element used in pre-amorphization implantation is at least one selected from a group consisting of Si+, C+, F+, Ge+, In+, Sb+, Xe+, Sn+, Ar+ and H+.

Wherein the semiconductor device is a CMOS device formed by an NMOS device and a PMOS device, and for the NMOS device the direction of the pre-amorphization implantation is at an angle of less than 45° to the normal of the semiconductor substrate, and for the PMOS device the direction of the pre-amorphization implantation is at an angle of greater than 45° to the normal of the semiconductor substrate.

Wherein an angle between the crystal lattice dislocation line and the channel for the NMOS device is greater than or equal to 90°, and an angle between the crystal lattice dislocation line and the channel for the PMOS device is less than or equal to 90°.

Wherein the crystal lattice dislocation line generates a compressive stress in the channel region for the PMOS device, and the crystal lattice dislocation line generates a tensile stress in the channel region for the NMOS device.

Wherein a groove is formed in the semiconductor substrates on either side of the gate structure, which is filled with a second semiconductor material, the second semiconductor material being different from the first semiconductor material.

Wherein the second semiconductor material is SiGe or Si:C.

Wherein the semiconductor substrate comprises a shallow trench isolation that includes a stress liner.

Wherein the gate structure and the second semiconductor material are covered with a stress layer.

According to another aspect of the present invention, a semiconductor device manufacturing method is provided, which comprises:

providing a semiconductor substrate of a first semiconductor material, on which a gate structure is formed;

forming a groove in the semiconductor substrates on either side of the gate structure;

performing pre-amorphization implantation to the semiconductor substrate, which implants ion into the semiconductor substrate through the groove so as to generate an amorphized region in the semiconductor substrate;

annealing the semiconductor substrate, during which the amorphized region is subject to a solid phase epitaxial growth to generate a crystal lattice dislocation line under the gate structure that results in a channel stress.

Wherein before the annealing step, a first strained layer is deposited on the semiconductor substrate, said first strained layer at least covers the inner surface of the groove.

Wherein after the annealing step, said method further comprises a step of removing the first strained layer.

Wherein after the step of removing the first strained layer, said method further comprises depositing or growing a second semiconductor material in the groove, said second semiconductor material being different from the first semiconductor material.

Wherein the second semiconductor material is SiGe or Si:C.

Wherein the crystal lattice dislocation line applies a mechanical stress to the channel region, and a compressive stress or a tensile stress is generated in the channel region according to the angle between the crystal lattice dislocation line and the channel.

Wherein the implantation element used in pre-amorphization implantation is at least one selected from a group consisting of Si+, C+, F+, Ge+, In+, Sb+, Xe+, Sn+, Ar+ and H+.

Wherein the semiconductor device is a CMOS device formed by an NMOS device and a PMOS device, and for the NMOS device the direction of the pre-amorphization implantation is at an angle of less than 45° to the normal of the semiconductor substrate, and for the PMOS device the direction of the pre-amorphization implantation is at an angle of greater than 45° to the normal of the semiconductor substrate.

Wherein an angle between the crystal lattice dislocation line and the channel for the NMOS device is greater than or equal to 90°, and an angle between the crystal lattice dislocation line and the channel for the PMOS device is less than or equal to 90°.

Wherein the crystal lattice dislocation line generates a compressive stress in the channel region for the PMOS device, and the crystal lattice dislocation line generates a tensile stress in the channel region for the NMOS device.

Wherein the semiconductor substrate comprises a shallow trench isolation that includes a stress liner.

A second strained layer is deposited on the semiconductor substrate, which covers the gate structure and the second semiconductor material.

According to the structure and method of the stress of the CMOS device being self-aligned and close to the channel as put forward by the present invention, an amorphized region is formed by means of heavy ion implantation and then crystal lattice dislocation lines having different obliquities are generated at the interface through an epitaxial growth. Through implantation into the source/drain grooves, and the obliquity of pre-amorphization implantation and/or covering the surface with a strained dielectric layer, crystal lattice dislocation lines of different obliquities are formed, thereby uniaxial tensile strain and uniaxial compressive strain are formed in the channel.

The present invention has the following technical effects: the structure and method of forming a strain close to the channel by self-aligning with high efficiency do not change the fundamental device structure, so they are highly compatible with the existing integrated circuit integrating process, and the process thereof is simple but effect, and is applicable to CMOS, meanwhile, they overcome the technical defect of integration that the conventional pre-amorphization implantation technique releases the source-drain epitaxial SiGe and Si:C layers.

BRIEF DESCRIPTION OF THE DRAWINGS

Throughout the figures, the same reference signs denote the same or similar components, wherein.

DETAILED DESCRIPTION OF THE PREFERRED EMBODIMENTS

One or more aspects of the embodiment of the present invention will be described below with reference to the figures, wherein throughout the figures, the same elements are usually represented by the same reference signs. In the descriptions below, many specific details are elucidated for the purpose of explanation, so that a thorough understanding of one or more aspects of the embodiment of the present invention can be provided. However, it is obvious to those skilled in the art that one or more aspects of the embodiment of the present invention may be implemented by a lower degree of said specific details.

In addition, although specific features or aspects of the embodiment are disclosed with respect to only one preferred embodiment among some preferred embodiments, such features or aspects can be combined with one or more other features or aspects of other preferred embodiments that might be desirable for and advantageous to any given or specific application.

Figure 1:
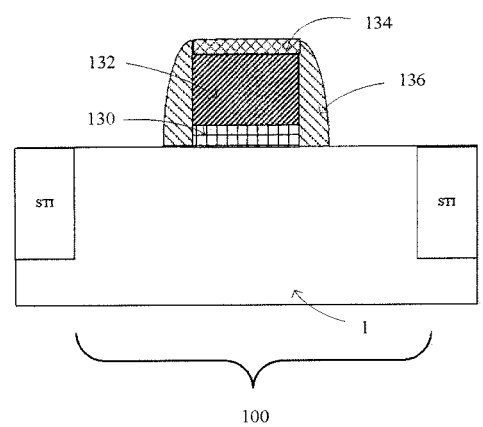
FIG. 1 shows a vertical sectional view of the intermediate structure of an exemplary semiconductor device manufacturing method according to one embodiment of the present invention.

FIG. 1 shows an exemplary semiconductor device manufacturing method according to an embodiment of the present invention. First, a semiconductor substrate 1 of a first semiconductor material is provided, which comprises a semiconductor region 100 (i.e. a first semiconductor region 100) defined by a shallow trench isolation (STI). The shallow trench isolation may include, for example, such a stress liner as silicon nitride (not shown in the figure). A gate structure is formed on the semiconductor region 100.

The semiconductor region 100 has a doping of a first conductive type and a first doping concentration. For example, the semiconductor region 100 may be an NMOS device region (e.g. an NMOS device region of a CMOS transistor) or a PMOS device region (e.g. a PMOS device region of a CMOS transistor), an NMOS device will be formed in the NMOS device region, and a PMOS device will be formed in the PMOS device region.

The first semiconductor material may be selected from, but not limited to, silicon, germanium, silicon-germanium alloy, silicon-carbon alloy, silicon-germanium-carbon alloy, gallium arsenide, indium arsenide, indium phosphide, groups III-V compound semiconductor materials, groups II-IV compound semiconductor materials, organic semiconductor materials and other compound semiconductor materials. Although the present invention is described with monocrystalline silicon, embodiments using other semiconductor materials are also explicitly contemplated herein.

The semiconductor substrate 1 may be a bulk substrate, a semiconductor-on-insulator (SOI) substrate or a hybrid substrate having a bulk portion and an SOI portion. Although the present invention is described with a bulk substrate, the embodiments using an SOI substrate or a hybrid substrate are also explicitly contemplated herein.

As shown in FIG. 1, the gate structure comprises a gate electrode. The gate electrode comprises a gate dielectric layer 130, a gate conductor layer 132 and a gate cap layer 134. In the example shown in FIG. 1, the gate structure further comprises spacers 136 formed on the two sides of the gate electrode opposite to each other, but the spacers 136 are not indispensable.

The material of the gate dielectric layer 130 may include a high K (dielectric constant) material or a low K material, for example, $SiO_2$, $ZrO_2$, $HfO_2$, $Al_2O_3$, HfSiO, HfSiON and/or a mixture thereof. With respect to a conventional CMOS, the gate dielectric layer usually comprises a low K material, such as $SiO_2$. With respect to a gate-first process or gate-last process of a high K dielectric/metal gate, the gate dielectric layer usually comprises a high K material, such as $ZrO_2$, $HfO_2$, $Al_2O_3$, HfSiO, HfSiON and/or a mixture thereof. Said gate dielectric layer may be formed through a thermal growing process, such as oxidizing, nitridizing, or oxynitriding. Alternatively, the gate dielectric layer may be formed by a depositing process, for example, Chemical Vapor Deposition (CVD), plasma-assisted CVD, Atomic Layer Deposition (ALD), evaporation, reactive sputtering, chemical solution deposition or other similar depositing processes, and the gate dielectric layer may also be formed by a combination of any of the above-mentioned processes.

The gate conductor layer 132 may comprise a conductive material of any type, which includes, but is not limited to, polysilicon, metal or metal alloy, silicide, conductive nitride, polycrystal silicon germanium or a combination thereof. With respect to a conventional CMOS device, the conductive material is usually polysilicon, for example, while with respect to a front gate process of a high K dielectric/metal gate, the conductive material may be metal or metal alloy.

The gate cap layer 134 includes such a dielectric material as dielectric oxide or dielectric nitride. For example, the gate cap layer may include silicon nitride. The gate cap layer 134 may be used as an etching mask during the etching to be described later. The material of the spacers 136 may include $SiO_2$, $Si_3N_4$ or SiON, and the like.

Figure 2:
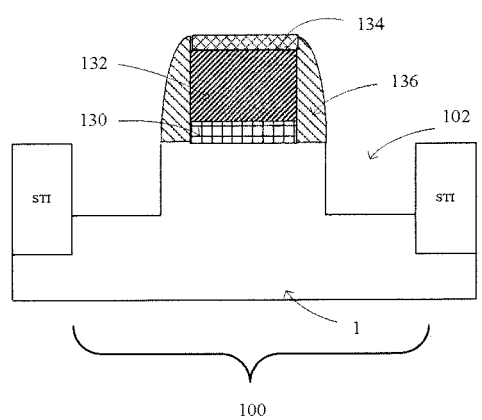
FIG. 2 shows a vertical sectional view of the intermediate structure of an exemplary semiconductor device manufacturing method according to one embodiment of the present invention.

Then, as shown in FIG. 2, grooves 120 are formed in the semiconductor substrate on the opposite sides of the gate structure using an etching process. The gate cap layer and the spacers can be used as mask in a subsequent process. As an example, the grooves are formed with a rectangular cross-section by anisotropic drying etching (e.g. RIE), the sidewalls of the grooves being perpendicular to the semiconductor substrate surface.

Those skilled in the art would understand that the grooves may be formed with other shapes. For example, the grooves are formed by anisotropic drying etching, and the sidewalls thereof tilt at a certain angle with respect to the substrate surface; or the grooves may also be formed by isotropic wet etching, but the cross-section of the grooves thus formed is usually a curve. With respect to a given etching rate, the size of the grooves can be adjusted according to the time of etching.

Figure 3:
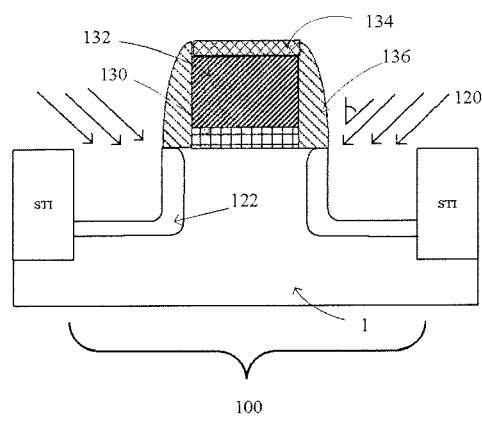
FIG. 3 shows a vertical sectional view of the intermediate structure of an exemplary semiconductor device manufacturing method according to one embodiment of the present invention.

Next, as shown in FIG. 3, pre-amorphization implantation 120 is performed to provide amorphized regions 122. The gate cap layer 134 and spacers 136 can be used as the blocking materials for the pre-amorphization implantation. The ions for the pre-amorphization implantation may be one or more ions selected from a group consisting of Si+, C+, F+, Ge+, In+, Sb+, Xe+, Sn+, Ar+ and H+. The implantation parameters (e.g. energy and dosage) may be appropriately selected to obtain lattice damage of a desired degree. It shall be understood that the size and shape of the amorphized regions may be adjusted effectively according to the parameters of the pre-amorphization implantation, namely, they can be adjusted according to the obliquity of ion implantation, the energy and dosage of the ions implanted, and the like. Preferably, with respect to the PMOS device region, the direction of the pre-amorphization implantation is at an angle of greater than 45° to the normal of the semiconductor substrate, with respect to the NMOS device region, the direction of the pre-amorphization implantation is at an angle of less than 45° to the normal of the semiconductor substrate. The amorphized regions are mainly located at the bottom of the grooves and under the gate structure.

Figure 4:
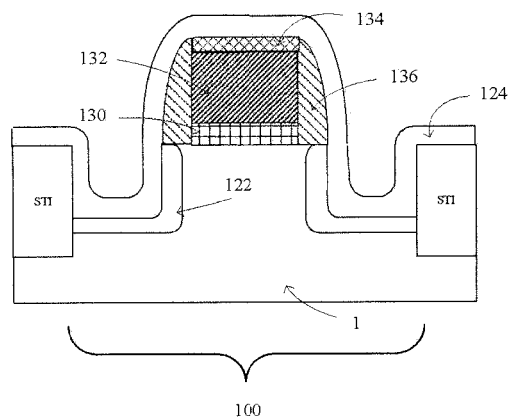
FIG. 4 shows a vertical sectional view of the intermediate structure of an exemplary semiconductor device manufacturing method according to one embodiment of the present invention.

Then, as shown in FIG. 4, a stress layer 124 is formed on the semiconductor substrate. The stress layer 124 covers the inner surfaces of the grooves, the gate structure and/or the shallow trench isolation. Alternatively, the stress layer 124 covers only the inner surface of the grooves. With respect to the NMOS device region, a tensile-stress layer is formed; with respect to the PMOS device region, a compressive-stress layer is formed. Both the tensile-stress layer and the compressive-stress layer may include silicon nitride ($Si_3N_4$) having an inherent strain. However, in a preferred embodiment, the compressive-stress layer includes high density plasma silicon nitride, i.e. silicon nitride formed by using a high density plasma deposition process.

Figure 5:
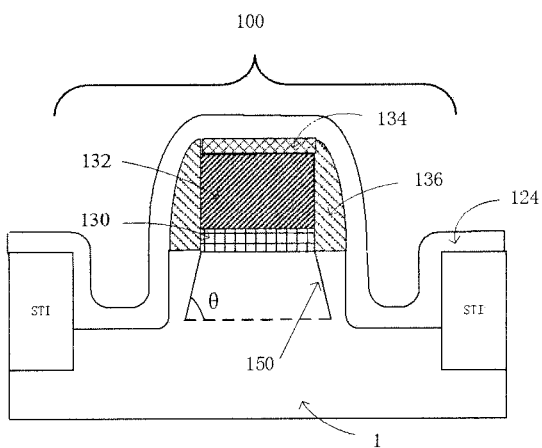
FIG. 5 shows a vertical sectional view of the intermediate structure of an exemplary semiconductor device manufacturing method according to one embodiment of the present invention.

Next, as shown in FIG. 5, annealing is performed, so that the amorphized regions are subject to a solid phase epitaxial growth and generates dislocation lines at the mask edges during the growth. The annealing process may include high temperature rapid annealing, laser annealing, low temperature and long time annealing, etc.

The annealing can memorize the stress in the semiconductor substrate 1 and re-crystallize the amorphized regions to convert them into doped crystallized regions. The annealing preferably includes using a temperature that is not lower than about 400° but not higher than about 1200°. The temperature of annealing is dependent on the time of annealing and the type and concentration of ions implanted. The temperature of annealing should be a temperature that enables memorization of the stress in the semiconductor substrate 1 while re-crystallizing the amorphized regions. After annealing, dislocation lines 150 will be formed in the semiconductor substrate under the gate structure (usually at a position corresponding to the channel). The dislocation lines in the channel will form different uniaxial tensile strains and uniaxial compressive strains.

The dislocation line is at an angle (i.e. the angle between the dislocation line and the channel) $\theta$ to the horizontal direction (a direction parallel to the surface of the semiconductor substrate), as shown in FIG. 5. The angle $\theta$ is usually defined as such: the two dislocation lines on the source and drain sides as shown in FIG. 5 are considered as two opposite sides of a quadrilateral (e.g. a trapezoid), and the inner angle at the lower left is called the angle $\theta$ between the dislocation line and the channel. With respect to the PMOS device region, $\theta$ is usually less than 90°, with respect to the NMOS device region, $\theta$ is usually greater than 90°.

Figure 6:
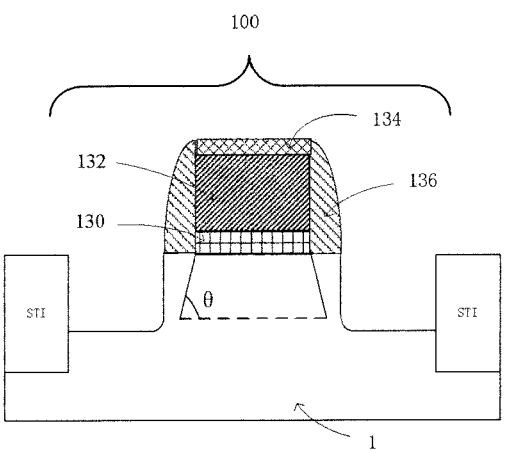
FIG. 6 shows a vertical sectional view of the intermediate structure of an exemplary semiconductor device manufacturing method according to one embodiment of the present invention.

Next, as shown in FIG. 6, the stress layer is removed. This step of removing may include wet or dry etching. For example, the silicon nitride stress layer is removed by wet stripping using hot phosphoric acid.

Figure 7:
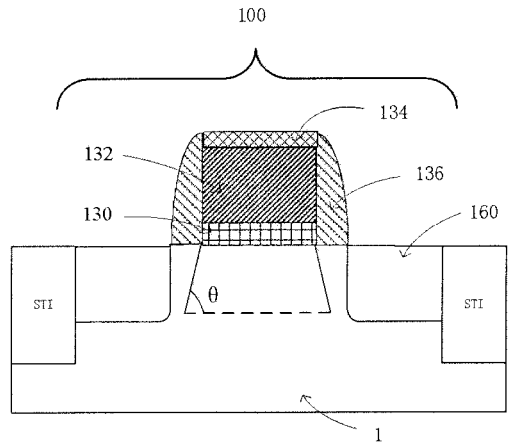
FIG. 7 shows a vertical sectional view of the intermediate structure of an exemplary semiconductor device manufacturing method according to one embodiment of the present invention.

Subsequently, as shown in FIG. 7, a second semiconductor material 160 is grown through selective epitaxy in the groove region. The second semiconductor material can be Si, but preferably, the second semiconductor material is a material different from the first semiconductor material.

During the epitaxial growth, a second semiconductor material is deposited on the exposed semiconductor surface, while no deposition occurs in the insulator surface, namely, the growth of the second semiconductor material is selective to the insulator surface. The exposed semiconductor surface mainly includes the inner surface of the grooves. The second semiconductor material epitaxially grown in the grooves forms a source region and a drain region.

With respect to a P type semiconductor device (i.e. PMOS device), the second semiconductor material may be $Si_{1-x}Ge_x$ (the atomic number percentage x of Ge may be 40%, and the content of Ge may be adjusted flexibly according to the need of the process, for example, x may be any value between 10%-70%, specifically, x may be 20%, 30%, 40%, 50% or 60%). The second semiconductor material may provide a compressive stress to the channel region of the PMOS device, which helps to improve the performance of the semiconductor device. The second semiconductor material may be formed by an epitaxial method using the silicon substrate as seed crystal.

With respect to an N type semiconductor device (i.e. an NMOS device), the second semiconductor material may be Si:C (the atomic number percentage of C may be 0-2%, for example, 0.5%, 1% or 1.5%, and the content of C may be adjusted flexibly according to the need of the process). The second semiconductor material may provide a tensile stress to the channel region of the NMOS device, which helps to improve the performance of the semiconductor device. The second semiconductor material may be formed by an epitaxial method using the silicon substrate as seed crystal.

Ion doping operation (i.e. doping in situ) may be directly performed during growing the second semiconductor material, for example, doping a reactant containing a doping ion component into the reactant for generating the second semiconductor material, or the ion doping may be performed through an ion implantation process after generating the second semiconductor material.

Doping in situ may have the following advantage: since the dopant introduced into the second semiconductor material is incorporated into the substituent position of the crystal lattice structure during the doping in situ, the need of activating and annealing the dopant is eliminated, thus minimizing the thermal diffusion of the dopant.

Although the present invention is described by the source region and drain region being substantially co-planar with the top surface of the semiconductor substrate 1, the source region and drain region may rise to be above the top surface of the semiconductor substrate, and said change is explicitly considered herein, in which the surface shapes of the source region and drain region may be, for example, rhombic. Alternatively, with respect to the PMOS device, the formed second semiconductor material is higher than the top surface of the semiconductor substrate; with respect to the NMOS device, the formed second semiconductor material is co-planar with the top surface of the semiconductor substrate.

Next, the original spacers 136 are removed, and then ion implantation is performed again to for source-drain extension regions 162. Then, spacers 136' are formed for the second time. Alternatively, a rapid annealing is performed to activate the implanted dopant.

Next, the gate cap layer 134 is removed by etching to expose the gate conductor layer 132.

Figure 8:
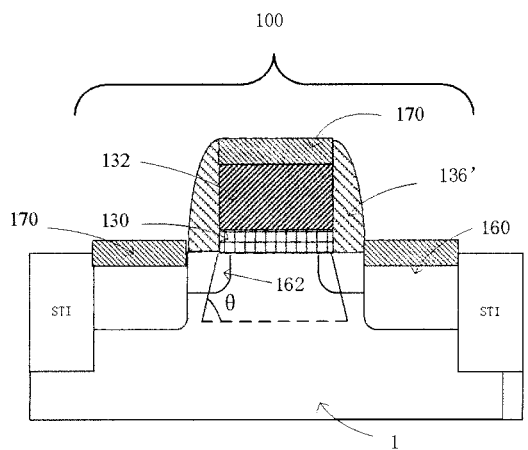
FIG. 8 shows a vertical sectional view of the intermediate structure of an exemplary semiconductor device manufacturing method according to one embodiment of the present invention.

Then, a metal layer is deposited and an anneal is carried out to induce the metal layer to react with the semiconductor material thereunder, thereby forming a metal semiconductor alloy 170 on the exposed semiconductor surface, as shown in FIG. 8. Specifically, the source and drain metal semiconductor alloys are formed on the source region and the drain region. The gate metal semiconductor alloy is formed on the gate conductor layer 132. In a case where the second semiconductor material includes such silicon alloy as silicon-germanium alloy or silicon carbon alloy, the source and drain metal semiconductor alloys include such silicide alloy as silicide-germanide alloy or silicide-carbon alloy. The methods for forming various metal semiconductor alloys are known in the art.

Figure 9:
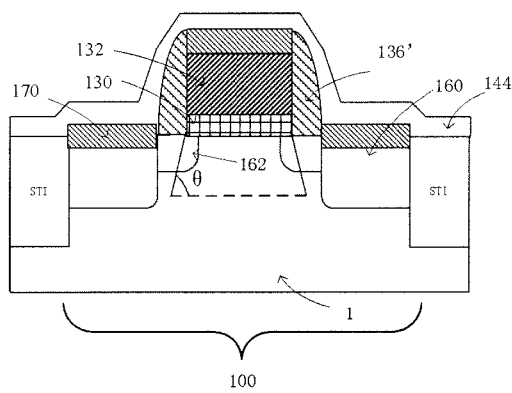
FIG. 9 shows a vertical sectional view of the intermediate structure of an exemplary semiconductor device manufacturing method according to one embodiment of the present invention.

Then, as shown in FIG. 9, a stress layer 140 is formed on the semiconductor substrate. With respect to the NMOS device region, a tensile-stress layer is formed; with respect to the PMOS device region, a compress-stress layer is formed.

Figure 10:
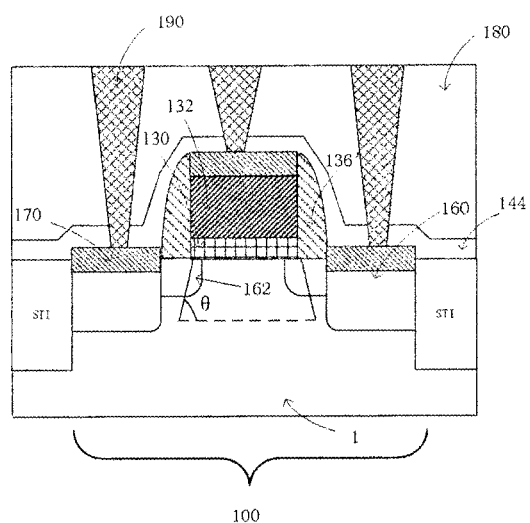
FIG. 10 shows a vertical sectional view of the final structure of an exemplary semiconductor device manufacturing method according to one embodiment of the present invention.

Next, as shown in FIG. 10, an interlayer dielectric layer 180 is formed on the stress layer, which can be one of or a combination of doped or undoped silicon oxide glass (e.g. fluorosilicone glass, borosilicate glass, phosphorosilicate glass, boron-phosphorosilicate glass, silicon-carbon oxide or silicon carbon oxynitride) and a dielectric material with a low dielectric constant (e.g. black diamond, coral). The interlayer dielectric layer may be formed by Chemical Vapor Deposition (CVD), Pulsed Laser Deposition (PLD), Atomic Layer Deposition (ALD), Plasma Enhanced Atomic Layer Deposition (PEALD) or other appropriate processes.

Various contact holes are formed in the stress layer and the interlayer dielectric layer and are filled with metal, so that various contact vias 190 are formed. To be specific, the contact vias are formed on the gate metal semiconductor alloy and are formed on the source and drain metal semiconductor alloys.

The second semiconductor material that is different from the first semiconductor material can apply a uniaxial stress in the channel region of the semiconductor region 100, so that the carrier mobility is increased through said uniaxial stress. When the first semiconductor material includes silicon, the semiconductor region 100 may be a PMOS device region, the second semiconductor material may be silicon-germanium alloy, the uniaxial stress may be a compressive stress, thus the hole mobility is increased through the uniaxial compressive stress. When the first semiconductor material includes silicon, the semiconductor region 100 may be an NMOS device region, the second semiconductor material may be silicon-carbon alloy, and the uniaxial stress may be a tensile stress, thus the electron mobility is increased through the uniaxial tensile stress.

In addition, the scope to which the present invention is applied is not limited to the process, mechanism, manufacture, material composition, means, methods and steps described in the specific embodiments in the specification. Those skilled in the art would readily appreciate from the disclosure of the present invention that the process, mechanism, manufacture, material composition, means, methods and steps currently existing or to be developed in future, which perform substantially the same functions or achieve substantially the same as that in the corresponding embodiments described in the present invention, may be applied according to the teaching of the present invention without departing from the protection scope thereof.

What is claimed is:

1. A semiconductor device, comprising:
a semiconductor substrate of a first semiconductor material,
a gate structure on the semiconductor substrate,
a groove formed in the semiconductor substrates on either side of the gate structure, and
a crystal lattice dislocation line in a channel under the gate structure for generating channel stress,
wherein the crystal lattice dislocation line is formed by pre-amorphization implantation and annealing, wherein after pre-amorphization implantation, a first strained layer is deposited on the semiconductor substrate before annealing, said first strained layer at least covers the inner surface of the groove,
wherein the first strained layer is removed after annealing, and
wherein the crystal lattice dislocation line being at an angle to the channel.

2. The semiconductor device according to claim 1, wherein the crystal lattice dislocation line applies a mechanical stress to the channel, a compressive stress or a tensile stress is generated in the channel according to the angle between the crystal lattice dislocation line and the channel.

3. The semiconductor device according to claim 1, wherein the implantation element used in pre-amorphization implantation is at least one selected from a group consisting of Si+, C+, F+, Ge+, In +, Sb+, Xe+, Sn+, Ar+ and H+.

4. The semiconductor device according to claim 1, wherein the semiconductor device is a CMOS device formed by an NMOS device and a PMOS device, and for the NMOS device the direction of the pre-amorphization implantation is at an angle of less than 45° to the normal of the semiconductor substrate, and for the PMOS device the direction of the pre-amorphization implantation is at an angle of greater than 45° to the normal of the semiconductor substrate.

5. The semiconductor device according to claim 4, wherein an angle between the crystal lattice dislocation line and the channel for the NMOS device is greater than or equal to 90°, and an angle between the crystal lattice dislocation line and the channel for the PMOS device is less than or equal to 90°.

6. The semiconductor device according to claim 5, wherein the crystal lattice dislocation line generates a compressive stress in the channel region for the PMOS device, and the crystal lattice dislocation line generates a tensile stress in the channel region for the NMOS device.

7. The semiconductor device according to claim 1, wherein the groove is filled with a second semiconductor material, the second semiconductor material being different from the first semiconductor material.

8. The semiconductor device according to claim 7, wherein the second semiconductor material is SiGe or Si:C.

9. The semiconductor device according to claim 7, wherein the gate structure and the second semiconductor material are covered with a stress layer.

10. The semiconductor device according to claim 1, wherein the semiconductor substrate comprises a shallow trench isolation that includes a stress liner.

11. A semiconductor device manufacturing method, comprising:
providing a semiconductor substrate of a first semiconductor material, on which a gate structure is formed;
forming a groove in the semiconductor substrates on either side of the gate structure;
performing pre-amorphization implantation to the semiconductor substrate, which implants ion into the semiconductor substrate through the groove so as to generate an amorphized region in the semiconductor substrate;
annealing the semiconductor substrate, during which the amorphized region is subject to a solid phase epitaxial growth to generate a crystal lattice dislocation line under the gate structure that results in a channel stress,
wherein before the annealing step, a first strained layer is deposited on the semiconductor substrate, said first strained layer at least covers the inner surface of the groove,
wherein after the annealing step, said method further comprises a step of removing the first strained layer.

12. The method according to claim 11, wherein after the step of removing the first strained layer, said method further comprises depositing or growing a second semiconductor material in the groove, said second semiconductor material being different from the first semiconductor material.

13. The method according to claim 12, wherein the second semiconductor material is SiGe or Si:C.

14. The method according to claim 12, further comprising depositing a second strained layer on the semiconductor substrate, which covers the gate structure and the second semiconductor material.

15. The method according to claim 11, wherein the crystal lattice dislocation line applies a mechanical stress to the channel region, and a compressive stress or a tensile stress is generated in the channel region according to the angle between the crystal lattice dislocation line and the channel.

16. The method according to claim 11, wherein the implantation element used in pre-amorphization implantation is at least one selected from a group consisting of Si+, C+, F+, Ge+, In +, Sb+, Xe+, Sn+, Ar+ and H+.

17. The method according to claim 11, wherein the semiconductor device is a CMOS device formed by an NMOS device and a PMOS device, and for the NMOS device the direction of the pre-amorphization implantation is at an angle of less than 45° to the normal of the semiconductor substrate, and for the PMOS device the direction of the pre-amorphization implantation is at an angle of greater than 45° to the normal of the semiconductor substrate.

18. The method according to claim 17, wherein an angle between the crystal lattice dislocation line and the channel for the NMOS device is greater than or equal to 90°, and an angle between the crystal lattice dislocation line and the channel for the PMOS device is less than or equal to 90°.

19. The method according to claim 18, wherein the crystal lattice dislocation line generates a compressive stress in the channel region for the PMOS device, and the crystal lattice dislocation line generates a tensile stress in the channel region for the NMOS device.

20. The method according to claim 11, wherein the semiconductor substrate comprises a shallow trench isolation that includes a stress liner.

* * * * *